United States Patent
Yang et al.

(12) 
(10) Patent No.: US 6,358,636 B1
(45) Date of Patent: Mar. 19, 2002

(54) THIN OVERLAYER FOR MAGNETIC RECORDING DISK

(75) Inventors: Ming M. Yang, San Jose; Zhangmin Wang, Mountain View; James L. Chao, Milpitas; Michael A. Russak, Pleasanton, all of CA (US)

(73) Assignee: HMT Technology Corporation, Freemont, CA (US)

(*) Notice: Subject to any disclaimer, the term of this patent is extended or adjusted under 35 U.S.C. 154(b) by 0 days.

(21) Appl. No.: 09/235,369

(22) Filed: Jan. 20, 1999

Related U.S. Application Data

(60) Provisional application No. 60/107,259, filed on Nov. 5, 1998, and provisional application No. 60/107,352, filed on Nov. 6, 1998.

(51) Int. Cl.[7] ............................. G11B 5/66; G11B 5/70; B32B 3/02; B32B 9/00
(52) U.S. Cl. ............................. 428/694 TP; 428/65.3; 428/336; 428/693; 428/694 TC; 428/900
(58) Field of Search ................. 428/65.3, 216, 428/336, 408, 693, 694 TC, 694 TP, 900

(56) References Cited

U.S. PATENT DOCUMENTS

| | | | | |
|---|---|---|---|---|
| 4,647,494 A | | 3/1987 | Meyerson et al. | 428/216 |
| 4,755,426 A | * | 7/1988 | Kokai et al. | 428/336 |
| 4,774,130 A | | 9/1988 | Endo et al. | 428/216 |
| 5,061,562 A | * | 10/1991 | Yamanaka et al. | 428/408 |
| 5,629,086 A | | 5/1997 | Hirano et al. | 428/336 |
| 5,679,431 A | | 10/1997 | Chen et al. | 428/65.3 |
| 5,780,119 A | | 7/1998 | Dearnaley et al. | 427/528 |

* cited by examiner

*Primary Examiner*—Paul Thibodeau
*Assistant Examiner*—Holly C. Rickman
(74) *Attorney, Agent, or Firm*—LeeAnn Gorthey

(57) ABSTRACT

Protective overlayers for magnetic recording media are described. The overlayers, composed of a transition metal-silicon or transition metal-germanium interlayer and a carbon overcoat, provide good wear resistance and corrosion resistance at thicknesses of less than 100 Å.

8 Claims, 3 Drawing Sheets

THIN OVERLAYER FOR MAGNETIC RECORDING DISK

The present application claims priority to U.S. provisional applications No. 60/107,259, filed Nov. 5, 1998, and No. 60/107,352, filed Nov. 6, 1998, both of which are incorporated herein by reference.

FIELD OF THE INVENTION

The present invention relates to a magnetic recording medium having a two-component overlayer, including an metallic interlayer and a carbon overcoat. The medium is of the type formed on a rigid disk for use in magnetic recording devices, such as a computer disk drive.

BACKGROUND OF THE INVENTION

Thin-film magnetic disks or media are widely used as data storage media for digital computers. These disks are typically formed by successively sputtering, onto a rigid disk substrate, an underlayer, a magnetic recording layer, and a carbon overcoat. The carbon overcoat protects the magnetic layer from wear, reduces the frictional forces between the disk and the read/write head, and protects the magnetic medium against environmental corrosion.

The continued growth in the storage capacity and recording density of thin film media requires reduction of the magnetic spacing between the head and the disk, with such spacing currently approaching less than one microinch. One approach to reducing magnetic spacing is reducing the thickness of the disk overcoat. A thin overcoat allows the head to fly closer to the magnetic film layer, which leads to improved magnetic recording properties. However, sputtered thin carbon overcoats, e.g., less than about 100 Å, do not generally provide adequate protection against wear and particularly against corrosion. A carbon coat overlying an intermediate silicon layer has been described (Meyerson et al., U.S. Pat. No. 4,647,494). However, these systems typically used relatively thick carbon layers (e.g. 250–400 Å), which impair magnetic recording performance, and they would not be expected to show adequate wear resistance or corrosion resistance at thicknesses less than 100 Å. It is therefore desirable to provide an overlayer material for such disks which is effective at thicknesses less than 100 Å.

SUMMARY OF THE INVENTION

In one aspect, the invention provides a two-component protective overlayer for a magnetic recording medium. The medium is of the type having a nonmagnetic, rigid disk substrate which supports a magnetic recording layer, typically including a nonmagnetic underlayer between the substrate and recording layer. The overlayer includes a protective carbon overcoat, and, between the magnetic recording layer and the carbon overcoat, a nonmagnetic metallic interlayer. The metallic interlayer is composed of a transition metal-silicon alloy or a transition metal-germanium alloy. Preferred transition metals include Ti, V, Cr, Mn, Fe, Co, Ni, Cu, Zr, Nb, Mo, Rh, Pd, Ta, W, Re, Os, and Ir. Particularly preferred transition metals are those, such as nickel, which form silicon or germanium alloys which bond well with cobalt or cobalt alloys. An exemplary compound is nickel-silicon alloy.

Preferably, the interlayer and carbon overcoat form a thin layer, having a combined thickness of about 40–100 Angstroms, and more preferably about 50–90 Angstroms. The carbon overcoat component preferably has a thickness of at least 30 Angstroms, while the metallic interlayer preferably has a thickness of at least 10 Angstroms.

The invention also provides a magnetic recording medium having such a two-component overlayer. The medium includes a nonmagnetic, rigid disk substrate, a nonmagnetic underlayer formed on the substrate, a magnetic recording layer, a protective carbon overcoat, and, between the magnetic recording layer and the carbon overcoat, a nonmagnetic metallic interlayer as described above. The magnetic recording layer is preferably composed of a cobalt alloy.

The invention also provides a method of forming a thin, wear-resistant and corrosion resistant overlayer on a rigid disk substrate, where the substrate preferably has a magnetic layer composed of a cobalt alloy. According to the method, an interlayer of a transition metal-silicon alloy or germanium alloy, having a thickness of about 10 to 40 Angstroms, is applied onto the magnetic layer, followed by the application of a carbon overcoat, having a thickness of about 30 to 60 Angstroms, onto the interlayer. The metallic interlayer is typically applied by sputter deposition from a target containing an alloy or intermetallic compound of a transition metal with silicon or germanium. The carbon overcoat may be applied by sputter deposition, ion beam deposition, or chemical vapor deposition, and may be doped with hydrogen and/or nitrogen.

DETAILED DESCRIPTION OF THE INVENTION

I. Magnetic Recording Medium

Figure 1:
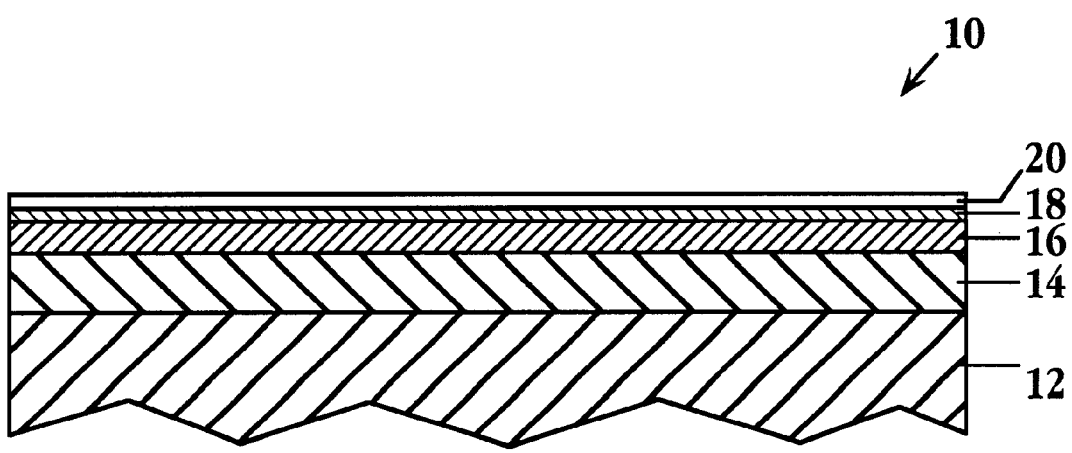
FIG. 1 shows, in cross section, a representative magnetic disk substrate of the invention, having a two-component overlayer consisting of a metallic interlayer (18) and carbon overcoat (20)

A portion of a typical thin-film medium or disk formed in accordance with the invention is shown in FIG. 1. Such a disk (10) generally includes a rigid substrate 12, and, forming successive thin-film layers over the substrate, a nonmagnetic crystalline underlayer 14, a magnetic thin-film layer 16, a nonmagnetic metallic interlayer 18, and a protective carbon overcoat 20. A thin layer (about 15 Å) of a perfluoropolyether lubricant may also be applied to the uppermost surface, over the carbon overcoat. It will be appreciated that the disk is symmetrical, with respect to its upper and lower surfaces, with both surfaces having this succession of layers.

The substrate 12 is typically metallic, such as a conventional Ni/P surface-coated aluminum disk, of the type used commonly for digital recording media. Alternatively, the substrate may be composed of a non-metallic material, such as glass, ceramic, glass-ceramic, carbon, silicon nitride, silicon carbide, or a heat-resistant polymer. The substrate is generally textured by any of the methods known in the art to achieve suitable friction during contact-start-stop with the recording head, yet is sufficiently smooth for acceptable flying head height.

The underlayer 14 is preferably crystalline and formed of a chromium-based material, i.e., chromium or a chromium-based alloy. Tungsten-based underlayers have also been used. The chromium-based alloy preferably contains at least 50 atomic percent chromium and the remainder one or more elements selected from Mo, Ta, Mn, V, W, Ru, Ti, Hf, Zr, Pt, Si, Ni, Al, Cu, B and Nb. The alloy can be binary or ternary. Exemplary binary alloys include CrRu, CrTi, CrMo, CrSi, CrV, and CrGd. The underlayer is sputtered to a thickness between about 200–3,000 Å.

The magnetic layer 16 is preferably a cobalt-based alloy which is formed on the underlayer, generally by sputtering, to a desired thickness, preferably between 100–800 Å. A "cobalt-based" alloy refers to an alloy containing at least 50 atomic percent cobalt. Exemplary binary cobalt-based alloys include Co/Cr or Co/Ni, and exemplary ternary, quaternary, and five-element alloys include Co/Cr/Ta, Co/Cr/Pt, Co/Ni/Pt, Co/Ni/Cr, Co/Cr/Ta/Pt, Co/Cr/Ni/Ta, Co/Cr/Ni/Pt, and Co/Cr/Ni/Pt/B. A preferred cobalt-based alloy is composed of 80–90% cobalt, 5–20% chromium and 2–10% tantalum. Another preferred cobalt-based alloy is composed of 70–90% cobalt, 5–20% chromium, 2–10% tantalum and 1–8% platinum.

It will be appreciated that the medium described is exemplary and media having other configurations, such as multiple recording layers separated by a nonmagnetic isolation layer, or media having additional underlayers, can also be formed by the method of the invention.

The present invention provides an overlayer for such a disk, which includes a metallic interlayer 18 and a carbon overcoat 20, as shown in FIG. 1. The overlayer provides excellent wear protection and corrosion protection, at a total thickness of less than 100 Å, preferably about 50–90 Å.

The metallic interlayer is composed of a transition metal-silicon alloy or transition metal-germanium alloy, such as nickel-silicon alloy, nickel-germanium alloy, iron-silicon alloy, iron-germanium alloy, etc. As used herein, a "transition metal-silicon alloy" or "transition metal-germanium alloy" refers to a metallic material composed of silicon or germanium, respectively, and a transition metal. It may include an intermetallic compound, an amorphous material, or a combination of any of these forms. A single transition metal is preferred, though compositions containing more than one transition metal may also be effective. The interlayer is typically formed by sputter deposition from a target containing an alloy or intermetallic compound of the transition metal compound with silicon or germanium. It may also be formed by sputtering from separate targets containing the components.

The transition metal component may be, for example, Ti, V, Cr, Mn, Fe, Co, Ni, Cu, Zr, Nb, Mo, Rh, Pd, Ta, W, Re, Os, or Ir. Particularly preferred transition metals are those, such as nickel, which form silicon or germanium alloys which bond well with cobalt or cobalt alloys. An exemplary material is nickel-silicon alloy.

Alloys and amorphous materials may vary in composition, and intermetallic compounds frequently exist in more than one molecular form (e.g. $NiSi_2$, $Ni_2Si$, $Fe_3Ge$, $FeGe_2$). As used herein, the term "nickel-silicon alloy" and the abbreviation "NiSi" refer to any nonmagnetic metallic composition consisting of the two elements, and does not necessarily imply a 1:1 molar ratio of the two elements. The preferred interlayers of the invention will generally include between 20 and 70 atom percent silicon or germanium, and the remainder transition metal.

The carbon overcoat is conventionally formed by sputter deposition onto the metallic interlayer. The carbon overcoat layer can be sputtered nitrogenated carbon, hydrogenated carbon, hydrogen doped-nitrogenated carbon, nitrogen doped-hydrogenated carbon, as well as ion beam carbon or CVD (chemical vapor deposition) carbon.

As stated above, the interlayer and carbon overcoat form a thin layer, having a combined thickness of about 40–100 Angstroms, and more preferably about 50–90 Angstroms. The carbon overcoat component preferably has a thickness of at least 30 Angstroms, while the metallic interlayer preferably has a thickness of at least 10 Angstroms.

II. Method of Preparing the Medium

The successive layers of the magnetic recording media of the invention may be prepared according to techniques well known in the art, using conventional sputtering systems, such as those available from Intevac (Santa Clara, Calif.), Circuits Processing Apparatus (Fremont, Calif.), ULVAC (Japan), VACTEC (Boulder, Colo.), ANELVA (Japan) or BPS (Germany). These systems are double-sided, in-line, high-throughput machines having two interlocking systems for loading and unloading. It will be appreciated that DC, RF and DC/RF systems, conventional or magnetron, are suitable.

The sputtering systems include a series of sputtering stations or chambers, for deposition of the layers comprising the medium. A typical sputtering apparatus includes a vacuum chamber having several stations at which sputtering or heating operations occur. A heating station at the upstream end of the chamber has a plurality of infrared lights which are arrayed for heating both sides of a substrate, which is carried through the station in the chamber on an aluminum disk holder. The sputtering stations, downstream of the heating station, include targets effective to sputter, for example, chromium, a chromium-based alloy, or other component of construction onto opposite sides of the substrate or substrates in the chamber. These targets are formed and shaped for use as sputtering targets by conventional metallurgical methods. Also included in the apparatus is a DC power source for placing a selected voltage potential, typically −50 to −750 volts with respect to ground, onto the substrate.

In operation, a sputtering chamber is evacuated to a pressure of about $10^{-7}$ torr, and argon gas is introduced into the chamber to a final sputtering pressure of 3–20 mTorr. A preferred argon gas pressure is 5 mTorr. The substrate is heated in the heating station to a selected temperature before advancing into each sputtering chamber, containing a target of the appropriate alloy or other component. The metallic interlayer of the invention is typically formed by sputter deposition from a target containing an alloy or intermetallic compound of the transition metal compound with silicon or germanium; it may also be formed by sputtering from separate targets containing the individual components.

For application of carbon overcoats composed of sputtered nitrogenated carbon, hydrogenated carbon, hydrogen doped-nitrogenated carbon, or nitrogen doped-hydrogenated carbon, nitrogen and/or hydrogen is introduced into the chamber, to produce a sputtering atmosphere that contains between 5–50 atomic percent nitrogen and/or hydrogen gas, with the balance argon or other inert gas. The carbon overcoat may also be applied by ion beam or chemical vapor deposition, although sputtering is the most commonly used method.

III. Medium Properties

Magnetic recording media were prepared on a nickel/phosphorus plated aluminum substrate having a chromium underlayer and a cobalt-based magnetic recording layer. Different experiments used magnetic layers having compositions of 72:14:6:8 Co/Cr/Ta/Ni or 72:17:4:5 Co/Cr/Ta/Pt, as noted below. Disks having varying thicknesses of the carbon overcoat (sputtered nitrogenated carbon) and interlayer (nickel-silicon alloy), as shown in the tables below, were prepared.

The nickel-silicon alloy interlayer was applied by sputtering from a target having a 1:1 atomic ratio of nickel and silicon. Initial analyses of the sputtered layer showed an approximately 1:1 atomic ratio and an amorphous structure; however, as described above, the interlayer is not limited to such a composition or structure.

As demonstrated by the data shown herein, the thin overlayers of the invention provide excellent wear resistance and corrosion resistance as well as good magnetic properties.

A. Wear Resistance

For good long-term disk and drive performance, it is desirable that a disk retain a relatively low coefficient of friction after many start/stop cycles or contacts with a read/write head. Static coefficients of friction (stiction values) are typically measured using a standard contact start-stop (CSS) test in which the peak level of friction is measured as the disk starts rotating from zero rpm to a selected revolution rate, e.g., 5000 rpm. After peak friction has been measured, the disk is brought to rest, and the start-stop process is repeated for a selected number of start-stop cycles (e.g., 20,000 cycles).

Figure 2A:
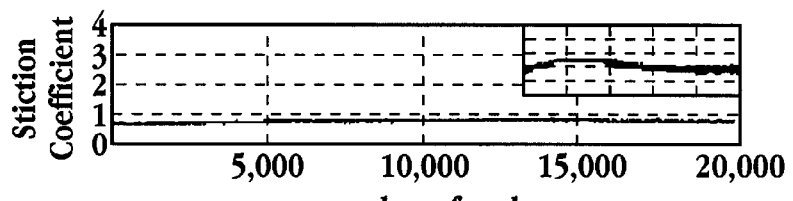
FIGS. 2A–2C are plots of stiction coefficient against number of cycles in contact-start-stop experiments under hot/wet conditions on magnetic recording media having a nickel-silicon alloy interlayer and carbon overcoat, at respective thicknesses of 30 Å/20 Å (FIG. 2A), 40 Å/40 Å (FIG. 2B), and 10 Å/50 Å (FIG. 2C), as shown in Table 1.
Figure 2B:
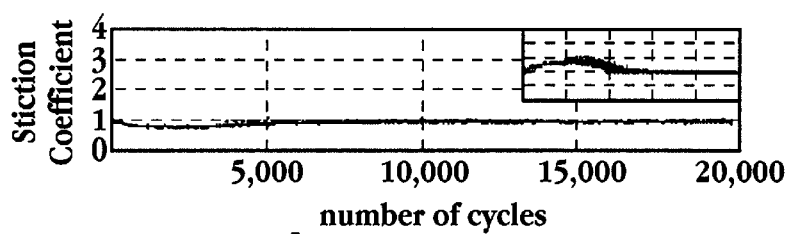
Figure 2C:
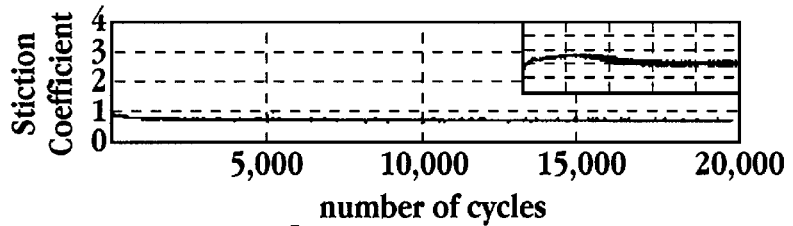
Figure 2D:
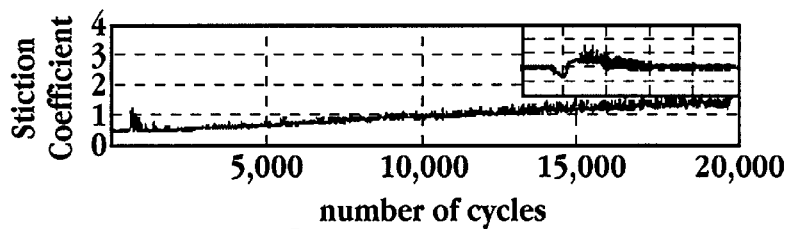
FIGS. 2D–2F are plots of stiction coefficient vs. number of cycles in CSS experiments run under hot/dry conditions on the disks of FIGS. 2A–2C.
Figure 2E:
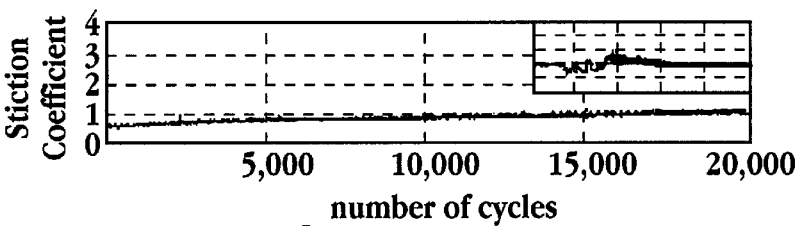
Figure 2F:
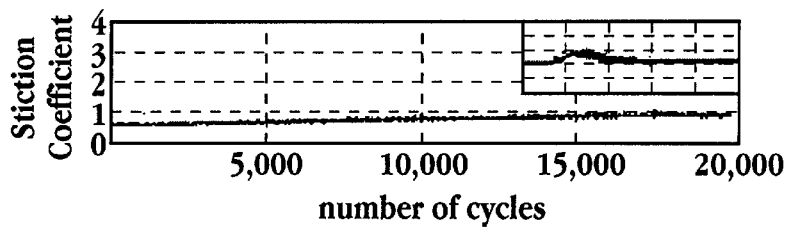

FIGS. 2A–2F are contact-start-stop (CSS) stiction traces, showing stiction coefficient vs. number of cycles, generated for disks having varying interlayer and carbon overcoat thicknesses, as shown in Table 1. Rows 1, 6, and 8 of the Table correspond to disks used for FIGS. 2A–C and 2D–F. Total overlayer thickness (first column) refers to the carbon overcoat (C:N; nitrogen content about 14 atom %) plus the nickel-silicon alloy interlayer. The tests were conducted under hot/wet (H/W) conditions (30° C., 80% relative humidity, FIGS. 2A–2C) and under hot/dry (H/D) conditions (55° C., 10% relative humidity; FIGS. 2D–2F), at varying substrate bias voltages, using a pico read-write head at 7200 rpm. Stiction coefficients (static coefficients of friction) from these tests are given in Table 1.

TABLE 1

Stiction Coefficients

| # | Total overlayer thickness, Å | NiSi thickness, Å | Hot/Wet Run 1 | Hot/Wet Run 2 | Hot/Dry Run 1 | Hot/Dry Run 2 |
|---|---|---|---|---|---|---|
| 1 | 50 | 30 | 0.83 | 1.10 | 1.52 | — |
| 2 | 60 | 30 | 0.98 | 1.23 | 1.28 | 1.13 |
| 3 | 70 | 30 | 1.05 | 1.13 | 0.73 | 1.25 |
| 4 | 80 | 30 | 1.40 | 0.94 | 0.86 | 1.06 |
| 5 | 60 | 40 | 0.95 | 0.71 | 0.96 | 1.15 |
| 6 | 80 | 40 | 0.94 | 0.87 | 1.16 | 0.99 |
| 7 | 60 | 20 | 0.96 | 1.01 | 0.70 | 2.06 |
| 8 | 60 | 10 | 0.70 | 1.18 | 0.80 | 1.02 |

Figure 3A:
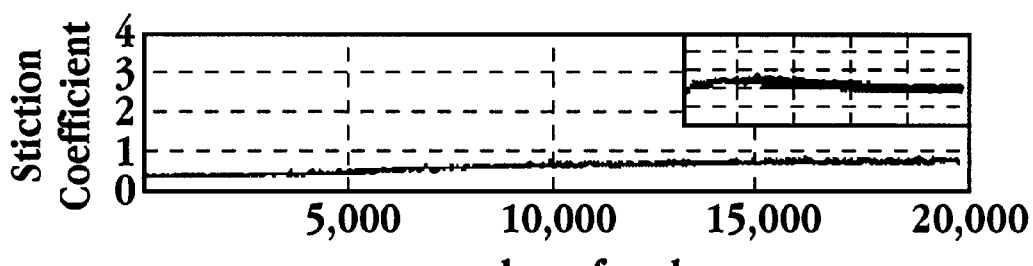
FIGS. 3A–3B are plots of stiction coefficient vs. number of cycles in CSS experiments run under hot/wet conditions on disks having a nickel-silicon alloy interlayer and carbon overcoat, at respective thicknesses of 30 Å/45 Å, using a nano read-write head (FIG. 3A) and a smaller pico read-write head (FIG. 3B)
Figure 3B:
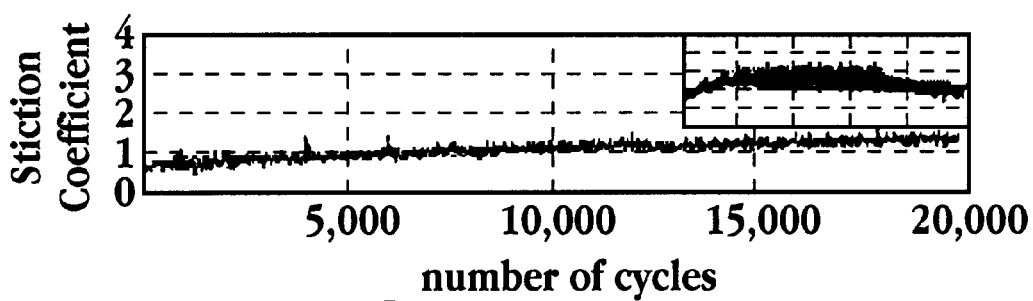
Figure 3C:
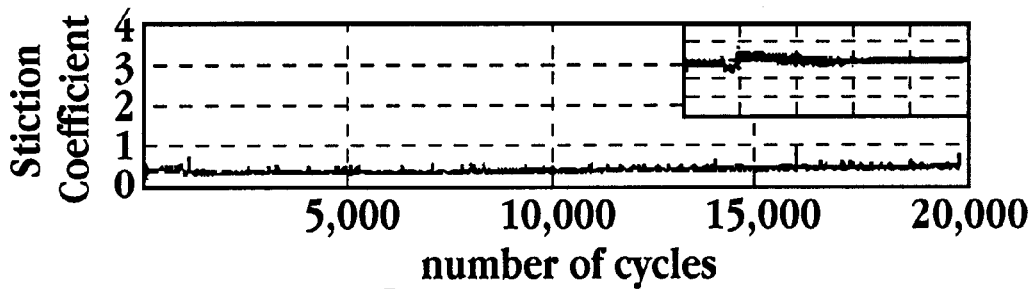
FIGS. 3C–3D are plots of stiction coefficient vs. number of cycles in CSS experiments run as described for FIGS. 3A–3B, but under hot/dry conditions (see Table 2).
Figure 3D:
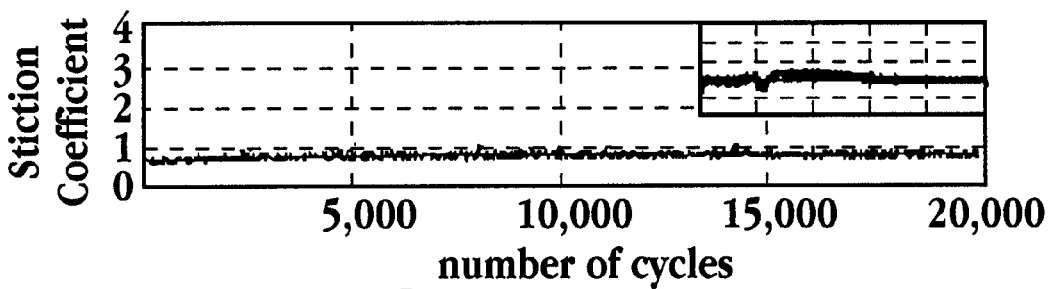

FIGS. 3A–3D show contact-start-stop stiction traces (3A–B, hot/wet; 3C–D, hot/dry) for disks having a carbon overcoat thickness of 45 Å and an interlayer thickness of 30 Å, using a nano head at 5400 rpm (FIGS. 3A and 3C) and a smaller pico head at 7200 rpm (FIGS. 3B and 3D). Stiction coefficients from a series of these tests are given in Table 2.

TABLE 2

Stiction Coefficients

| Total overlayer thickness, Å | NiSi thickness, Å | Read/write head | Hot/Wet | Hot/Dry |
|---|---|---|---|---|
| 75 | 30 | nano | 0.57 | 1.07 |
| 75 | 30 | nano | — | 0.72 |
| 75 | 30 | nano | 0.82 | 0.94 |
| 75 | 30 | nano | 0.81 | 1.33 |
| 75 | 30 | pico | 2.01 | 0.83 |
| 75 | 30 | pico | 1.48 | 0.71 |
| 75 | 30 | pico | 1.81 | 0.83 |
| 75 | 30 | pico | 1.74 | 0.53 |

The stiction data above is comparable or superior to that typically obtained for conventional disks having carbon-only overcaots. Wear resistance of the present overcoats was excellent. No head crashes occurred in any of the tests, and examination of the disks at 200× magnification after testing showed no visible wear tracks.

B. Corrosion Resistance

In a standard test for corrosion resistance, disks prepared in accordance with the invention, having a nickel-silicon alloy interlayer overlying the cobalt-containing magnetic layer, were subjected to a hot/wet stress treatment (60° C. at 80% relative humidity for 96 hrs) and then washed with deionized water. The water wash was analyzed by ion chromatography for levels of cobalt and nickel ion. The data is presented in Tables 3–4 for disks having various thicknesses of metallic interlayer and carbon overcoat, as shown in the Tables.

For the data in Table 3, NiSi interlayer thickness was 30 Å for each disk, and total overlayer thickness, including the carbon overcoat, was as shown. The magnetic layer was composed of Co/Cr/Ta/Ni 72:14:6:8. For the data in Table 4, the magnetic layer was composed of Co/Cr/Ta/Pt 74:17:4:5, and substrate bias was 0V in all cases.

TABLE 3

Corrosion Resistance (Cobalt and Nickel Removal Levels)

| | | Co (µg/disk) | | Ni (µg/disk) | |
|---|---|---|---|---|---|
| Total overlayer thickness, Å | Substrate bias, V | before stress | after stress | before stress | after stress |
| 80 | 0 | 0.168 | 0.225 | 0.116 | 0.069 |
| 80 | −100 | 0.212 | 0.261 | 0.234 | 0.065 |
| 80 | −200 | 0.139 | 0.248 | 0.372 | 0.138 |
| 60 | 0 | 0.053 | 0.109 | 0.407 | 0.099 |
| 60 | −100 | 0.206 | 0.343 | 0.274 | 0.095 |
| 60 | −200 | 0.088 | 0.204 | 0.231 | 0.133 |

TABLE 4

Corrosion Resistance (Cobalt and Nickel Removal Levels)

| | | Co (µg/disk) | | Ni (µg/disk) | |
|---|---|---|---|---|---|
| Total overlayer thickness, Å | NiSi interlayer thickness, Å | before stress | after stress | before stress | after stress |
| 50 | 30 | 0.232 | 0.260 | 0.855 | 0.200 |
| 60 | 30 | 0.130 | 0.250 | 0.703 | 0.150 |
| 70 | 30 | 0.098 | 0.160 | 0.933 | 0.180 |

TABLE 4-continued

Corrosion Resistance (Cobalt and Nickel Removal Levels)

| Total overlayer thickness, Å | NiSi interlayer thickness, Å | Co (µg/disk) before stress | Co (µg/disk) after stress | Ni (µg/disk) before stress | Ni (µg/disk) after stress |
|---|---|---|---|---|---|
| 60 | 40 | 0.349 | 0.160 | 0.414 | 0.070 |
| 60 | 20 | 0.143 | 0.230 | 1.002 | 0.230 |
| 60 | 10 | 0.128 | 0.320 | 1.128 | 0.310 |

Cobalt removal level after stress averaged about 0.23 µg/disk. In comparison, similar tests run on disks having a 120 Å carbon overcoat, with no metallic interlayer, generally show about 0.80 to 1.0 µg/disk Co removal after stress, by IC, for disks having a Co/Cr/Ta/Ni 72:14:6:8 magnetic layer (as in Table 3), and about 0.2 µg/disk for disks having a Co/Cr/Ta/Pt 74:17:4:5 magnetic layer (as in Table 4). The above data show comparable or improved corrosion resistance (i.e., less Co washout after stress) for total overlayer thicknesses of only 50–80 Å, using a thin carbon overcoat and thin nickel-silicon alloy interlayer.

It was also observed that the substrates with a Co/Cr/Ta/Ni magnetic layer (Table 4) showed less washout of nickel, possibly as an effect of bonding between the nickel-containing magnetic layer and NiSi interlayer.

C. Magnetic Properties

Tables 5–7 give magnetic properties of substrates having a 30 Å nickel-silicon alloy interlayer and a 30–50 Å carbon (C:N) overcoat, compared with control substrates having equal or greater thicknesses of carbon overcoat only (no metallic interlayer), as shown in the Tables. Table 5 shows values of coercivity (Hc), magnetic remanence thickness product (Mrt), remanence squareness (S*), and switching field distribution (SFD). (In each of these properties but the last, an increase in the numeric value indicates an improvement. For example, the higher the coercivity, the narrower a data bit can be written and sensed.)

As the data shows, the present disks (rows 1 and 2) have magnetic properties which are equivalent or superior to those having carbon-only overlayers (rows 3 and 4). Disks with carbon-only overlayers generally show poorer magnetic properties at higher thicknesses, but reduced corrosion resistance, due to porosity, and impaired tribology (e.g. wear resistance) at lower thicknesses.

TABLE 5

Magnetic Properties

| Overlayer type | Total overlayer thickness, Å | Interlayer thickness, Å | Hc (Oe) | Mrt (memu/cm$^2$) | S* | SFD |
|---|---|---|---|---|---|---|
| C:N/NiSi | 60 | 30 | 2658 | 0.69 | 0.832 | 0.183 |
| C:N/NiSi | 80 | 30 | 2758 | 0.71 | 0.848 | 0.177 |
| C:N/C | 60 | — | 2555 | 0.66 | 0.802 | 0.241 |
| C:N/C | 100 | — | 2596 | 0.67 | 0.795 | 0.228 |

Tables 6A–6B give values for overwrite, pulse width at 50% amplitude (PW$_{50}$), track average amplitude at high frequency and low frequency, and resolution (TAA$_{HF}$/TAA$_{LF}$), measured at two different zones of the disk. In each of these properties except pulse width, which is generally inversely related to coercivity, an increase in the numeric value indicates an improvement.

TABLE 6A

Magnetic Properties (Zone 1: Track #743)

| Overlayer type | Total overlayer thickness, Å | Interlayer thickness, Å | Overwrite (-dB) | PW$_{50}$ (nsec) | Resolution | TAA$_{HF}$ (µv) | TAA$_{LF}$ (µv) |
|---|---|---|---|---|---|---|---|
| C:N/NiSi | 75 | 30 | 35.78 | 16.4 | 39.4% | 0.354 | 0.899 |
| C:N/C | 75 | — | 35.16 | 16.87 | 39.6% | 0.343 | 0.869 |
| C:N/C | 100 | — | 38.42 | 16.63 | 39.5% | .0309 | 0.849 |

TABLE 6B

Magnetic Properties (Zone 3: Track #13171)

| Overlayer type | Total overlayer thickness, Å | Interlayer thickness, Å | Overwrite (-dB) | PW$_{50}$ (nsec) | Resolution | TAA$_{HF}$ (µv) | TAA$_{LF}$ (µv) |
|---|---|---|---|---|---|---|---|
| C:N/NiSi | 75 | 30 | 35.9 | 11.83 | 23.7% | 0.179 | 0.759 |
| C:N/C | 75 | — | 36.64 | 12.19 | 23.2% | 0.174 | 0.748 |
| C:N/C | 100 | — | 36.4 | 12.49 | 22.2% | 0.150 | 0.676 |

Table 7 shows NLTS (non-linear transition shift), signal/noise, noise level, and amplitude for the same disks shown in Tables 6A–B. Again, the present substrates are comparable or superior in these properties to those having carbon-only overlayers of equal or greater thickness.

TABLE 7

| Overlayer type | Total overlayer thickness, Å | Interlayer thickness, Å | NLTS (%) | S/N (dB) | Noise (µv) | Amp (µv) |
|---|---|---|---|---|---|---|
| C:N/NiSi | 75 | 30 | 19.56 | 4.13 | 5.87 | 9.42 |
| C:N/C | 75 | — | 20.69 | 3.78 | 5.63 | 8.70 |
| C:N/C | 100 | — | 22.71 | 1.47 | 5.22 | 6.33 |

While the invention has been described with reference to specific methods and embodiments, it will be appreciated that various modifications may be made without departing from the invention.

It is claimed:

1. A protective overlayer for a magnetic recording medium, said medium having a nonmagnetic, rigid disk substrate supporting an optional nonmagnetic underlayer and a magnetic recording layer, said overlayer comprising a carbon overcoat, and a nonmagnetic metallic interlayer, composed of a nickel-silicon alloy or a nickel-germanium alloy, between and abutting said magnetic recording layer and said carbon overcoat, wherein said interlayer has a thickness of about 10–40 Angstroms, and said interlayer and carbon overcoat have a combined thickness of about 50–90 Angstroms.

2. The overlayer of claim 1, wherein the Ni-silicon alloy or Ni germanium alloy includes from about 20 to 70 atom percent silicon or germanium, and the remainder Ni.

3. The overlayer of claim 1, wherein the interlayer is a nickel-silicon alloy.

4. The overlayer of claim 1, wherein said carbon overcoat is composed of carbon doped with hydrogen, nitrogen, or a combination thereof.

5. A magnetic recording medium, comprising:

a nonmagnetic, rigid disk substrate, a nonmagnetic underlayer overlying said substrate, a magnetic recording layer overlying said underlayer, carbon overcoat, and a nonmagnetic metallic interlayer, composed of a nickel-silicon alloy or a nickel-germanium alloy, between and abutting said magnetic recording layer and said carbon overcoat, wherein said interlayer has a thickness of about 10–40 Angstroms, and said interlayer and carbon overcoat have a combined thickness of about 50–90 Angstroms.

6. The medium of claim 5, wherein the Ni-silicon alloy or Ni germanium alloy includes from about 20 to 70 atom percent silicon or germanium, and the remainder Ni.

7. The medium of claim 5, wherein the interlayer is a nickel-silicon alloy.

8. The medium of claim 5, wherein the magnetic recording layer is composed of a cobalt alloy.

* * * * *